United States Patent
Glicksman et al.

(10) Patent No.: US 10,190,198 B2
(45) Date of Patent: *Jan. 29, 2019

(54) THICK FILM PASTE AND USE THEREOF

(71) Applicant: E I DU PONT DE NEMOURS AND COMPANY, Wilmington, DE (US)

(72) Inventors: Howard David Glicksman, Durham, NC (US); Adele Amelia Pliscott, Bristol (GB)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/679,544

(22) Filed: Aug. 17, 2017

(65) Prior Publication Data

US 2017/0342528 A1    Nov. 30, 2017

Related U.S. Application Data

(63) Continuation of application No. 13/532,903, filed on Jun. 26, 2012, now Pat. No. 9,783,874.

(60) Provisional application No. 61/503,055, filed on Jun. 30, 2011.

(51) Int. Cl.
| | |
|---|---|
| *H01B 1/22* | (2006.01) |
| *C22C 32/00* | (2006.01) |
| *B05D 5/12* | (2006.01) |
| *H05K 1/09* | (2006.01) |
| *H05K 1/03* | (2006.01) |
| *H05K 3/12* | (2006.01) |

(52) U.S. Cl.
CPC ............ *C22C 32/0021* (2013.01); *B05D 5/12* (2013.01); *H01B 1/22* (2013.01); *H05K 1/092* (2013.01); *B22F 2998/00* (2013.01); *H05K 1/0306* (2013.01); *H05K 3/1216* (2013.01); *H05K 3/1291* (2013.01)

(58) Field of Classification Search
CPC ... H01B 1/00; H01B 1/16; H01B 1/22; B05D 5/12; H05K 1/092
See application file for complete search history.

(56) References Cited

U.S. PATENT DOCUMENTS

| | | | |
|---|---|---|---|
| 3,914,169 A | 10/1975 | Horowitz | |
| 4,963,187 A | 10/1990 | Kondo et al. | |
| 5,491,118 A | 2/1996 | Hormadaly | |
| 5,518,663 A * | 5/1996 | LaBranche | C09D 5/24 252/512 |
| 6,165,247 A | 12/2000 | Kodas et al. | |
| 6,372,158 B1 * | 4/2002 | Hashimoto | H01B 1/22 252/514 |
| 6,679,938 B1 | 1/2004 | Kim et al. | |
| 7,494,607 B2 | 2/2009 | Wang et al. | |
| 9,783,874 B2 * | 10/2017 | Glicksman | C22C 32/0021 |
| 2004/0188659 A1 | 9/2004 | Tomita et al. | |
| 2005/0127825 A1 | 6/2005 | Bae et al. | |
| 2006/0231803 A1 | 10/2006 | Wang et al. | |
| 2013/0004659 A1 | 1/2013 | Glicksman et al. | |

FOREIGN PATENT DOCUMENTS

| | | |
|---|---|---|
| CN | 1130795 A | 9/1996 |
| CN | 101055776 A | 10/2007 |
| JP | 401081106 A * | 3/1989 |
| JP | H01317183 A | 12/1989 |
| JP | 2005340050 A | 5/2004 |

OTHER PUBLICATIONS

International Search Report dated Oct. 17, 2012 for International Application No. PCT/US2012/044478.

* cited by examiner

*Primary Examiner* — Mark Kopec

(57) ABSTRACT

A thick film paste comprising at least one particulate platinum (alloy), at least one metal compound, and an organic vehicle, wherein the at least one metal compound is selected from the group consisting of in each case particulate NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$ and $MoO_2$, and metal compounds capable of forming a metal oxide on firing, the metal oxide being selected from the group consisting of NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$ and $MoO_2$.

16 Claims, No Drawings

THICK FILM PASTE AND USE THEREOF

CROSS-REFERENCE TO RELATED APPLICATIONS

This application is a continuation of U.S. application Ser. No. 13/532,903, filed Jun. 26, 2013, and now U.S. Pat. No. 9,783,874, issued Oct. 10, 2017, and further claims benefit of U.S. Provisional Patent Application Ser. No. 61/503,055, filed Jun. 30, 2011.

FIELD OF THE INVENTION

The invention is directed to a thick film paste and the use thereof in the production of metallizations which may serve as electrical contacts for electrodes of sensor devices.

TECHNICAL BACKGROUND OF THE INVENTION

U.S. Pat. No. 6,165,247 discloses a pyrolysis method for the production of platinum metal, platinum alloy or platinum composite particles.

The method for the production of platinum metal particles comprises the steps of: a) generating an aerosol of droplets from a liquid wherein said liquid comprises a platinum metal precursor and wherein said droplets have a size distribution such that at least about 80 wt. % (weight percent) of said droplets have a size of from about 1 μm to about 5 μm; b) moving said droplets in a carrier gas; and c) heating said droplets to remove liquid therefrom and form platinum metal particles.

The method for the production of platinum alloy particles comprises the steps of: a) forming a liquid solution comprising a platinum metal precursor and a second metal precursor; b) generating an aerosol of droplets from said liquid solution; c) moving said droplets in a carrier gas; d) heating said droplets to remove liquid therefrom and form metal alloy particles comprising platinum metal and the second metal.

The method for the production of platinum composite particles comprises the steps of: a) forming a liquid solution comprising a platinum metal precursor and a non-metallic phase precursor; b) generating an aerosol of droplets from said liquid solution; c) moving said droplets in a carrier gas; d) heating said droplets to remove liquid therefrom and form metal composite particles comprising platinum metal and a non-metallic phase. The non-metallic phase may be a metal oxide in particular.

The platinum metal, platinum alloy or platinum composite particles can be used in the manufacture of thick film pastes which can be applied and fired to form electrodes on sensor devices, such as oxygen sensors.

SUMMARY OF THE INVENTION

The invention relates to a thick film paste comprising at least one particulate platinum (alloy), at least one metal compound, and an organic vehicle, wherein the at least one metal compound is selected from the group consisting of in each case particulate NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$ and $MoO_2$, and metal compounds capable of forming a metal oxide on firing, the metal oxide being selected from the group consisting of NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$ and $MoO_2$.

DETAILED DESCRIPTION OF THE INVENTION

It has been found that the thick film paste of the invention allows for the production of metallizations which may serve as electrical contacts (e.g. contact pads) for electrodes of sensor devices, in particular, high temperature gas sensor devices such as exhaust gas sensor devices with improved properties. The improved properties may include improved topography of the finished metallizations as expressed by a smooth appearance with less printing mesh marks, less surface defects like splining, cracks, splits, bubbles and blisters; an improved weldability, in particular improved laser weldability; and an extended service life.

The thick film paste of the invention comprises at least one particulate platinum (alloy).

The term "platinum (alloy)" is used herein. It shall mean platinum or a platinum alloy with one or more alloying metals like, for example, silver, gold, ruthenium, rhodium, iridium or, in particular palladium. The platinum alloys comprise, for example, 40 to 99.9 wt. %, preferably 50 to 99.9 wt. % of platinum. The at least one particulate platinum (alloy) may comprise platinum (alloy) particles in various shapes, for example, platinum (alloy) flakes and platinum (alloy) powder including spherical-shaped platinum (alloy) powder and nodular-shaped (irregular-shaped) platinum (alloy) powder, or any combinations thereof. In a preferred embodiment, the particulate platinum (alloy) is platinum (alloy) powder, in particular, spherical-shaped platinum (alloy) powder.

Platinum (alloy) powder, in particular spherical-shaped platinum (alloy) powder, can in particular be produced by a pyrolysis process as disclosed in the aforementioned patent document U.S. Pat. No. 6,165,247, to which express reference is made herewith.

The platinum (alloy) powder may exhibit an average particle size of, for example, 0.8 to 1.4 μm.

The term "average particle size" is used herein. It shall mean the average particle size (mean particle diameter, d50) determined by means of laser light scattering. Laser light scattering measurements can be carried out making use of a particle size analyzer, for example, a Microtrac S3500 machine.

All statements made in the present description and the claims in relation to average particle sizes relate to average particle sizes of the relevant materials as are present in the thick film paste as supplied to the user or customer.

The platinum (alloy) powder may comprise crystallites having a size of, for example, 40 to 70 nm.

The thick film paste of the invention comprises at least one metal compound selected from the group consisting of in each case particulate NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$ and $MoO_2$, and metal compounds capable of forming a metal oxide on firing, the metal oxide being selected from the group consisting of NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$, and $MoO_2$. Particulate metal oxide(s) selected from the group consisting of NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$ and $MoO_2$ is (are) preferred. Particulate $RuO_2$, $TiO_2$, $ZrO_2$, MgO, $MnO_2$ and metal compounds capable of forming $RuO_2$, $TiO_2$, $ZrO_2$, MgO or $MnO_2$ on firing are particularly preferred.

The at least one metal compound is contained in the thick film paste of the invention in a proportion of 0.001 to 1 wt. %, or, in an embodiment, 0.03 to 0.1 wt. %, based on total thick film paste composition.

In the present description and the claims the term "total thick film paste composition" is used. It shall mean thick film paste as supplied to the user or customer.

The surface area of the aforementioned particulate metal oxide(s) selected from the group consisting of NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$ and $MoO_2$ may be in the range of, for example, 1 to 25 $m^2/g$, as measured by the BET method.

Examples of metal compounds capable of forming a metal oxide selected from the group consisting of NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$ and $MoO_2$ on firing comprise in particular corresponding inorganic or metal-organic compounds such as, for example, metal carbonates, metal carboxylic acid salts or metal resinates (metal salts of acidic resins, in particular, resins with carboxyl groups). Such metal compound(s) may be present in the thick film paste of the invention in dissolved or in particulate form.

In an embodiment, the thick film paste of the invention may comprise at least one particulate platinum (alloy)/metal oxide composite having a weight ratio of elemental platinum plus optionally present alloying metal(s):metal oxide of, for example, 100:1 to 1000:1, wherein the metal oxide is preferably selected from the group consisting of NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$, and $MoO_2$. Preferred are: particulate platinum (alloy)/$ZrO_2$ composites with an elemental platinum plus optionally present alloying metal(s):$ZrO_2$ weight ratio of 100:1 to 200:1, particulate platinum (alloy)/MgO composites with an elemental platinum plus optionally present alloying metal(s):MgO weight ratio of 100:1 to 200:1, particulate platinum (alloy)/$TiO_2$ composites with an elemental platinum plus optionally present alloying metal(s):$TiO_2$ weight ratio of 100:1 to 200:1, and particulate platinum (alloy)/$MnO_2$ composites with an elemental platinum plus optionally present alloying metal(s):$MnO_2$ weight ratio of 100:1 to 200:1.

Particulate platinum metal (alloy)/metal oxide composites are individual particles that include a platinum (alloy) metal phase and at least one metal oxide phase associated with the platinum (alloy) metal phase. For example, the metal composite particles can include a metal oxide dispersed throughout the platinum (alloy) metal phase or a metal oxide substantially on the outside of the platinum (alloy) metal particulate. Preferred metal oxides to be named in that context comprise NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$ and $MoO_2$.

Particulate platinum (alloy)/metal oxide composites can in particular be produced by a pyrolysis process as disclosed in the aforementioned patent document U.S. Pat. No. 6,165,247, to which express reference is made herewith.

The optionally present at least one particulate platinum (alloy)/metal oxide composite may exhibit an average particle size of, for example, 0.8 to 1.4 μm. Its surface area may be in the range of, for example, 0.4 to 1.0 $m^2/g$ as measured by the BET method. It may have a density of, for example, 19 to 22.5 g/ml as measured by Helium pycnometry.

The total proportion of particulate platinum (alloy) plus the optionally present particulate platinum (alloy)/metal oxide composite in the thick film paste of the invention is 84 to 95 wt. %, or, in an embodiment, 88 to 93 wt. %, based on total thick film paste composition. In case the thick film paste comprises particulate platinum (alloy)/metal oxide composite, the weight ratio of particulate platinum (alloy): particulate platinum (alloy)/metal oxide composite may be in the range of, for example, 20:80 to 99.9:0.1. In case the thick film paste composition contains no particulate platinum (alloy)/metal oxide composite, the total proportion of particulate platinum (alloy) is 84 to 95 wt. %, or, in an embodiment, 88 to 93 wt. %, based on total thick film paste composition.

Generally, the thick film paste of the invention comprises no other inorganic constituents than the at least one particulate platinum (alloy), the at least one metal compound and the optional at least one particulate platinum (alloy)/metal oxide composite.

The thick film paste of the invention comprises an organic vehicle. A wide variety of inert viscous materials can be used as organic vehicle. The organic vehicle may be one in which the particulate constituents (particulate platinum (alloy), the optional particulate platinum (alloy)/metal oxide composite, particulate metal compound) are dispersible with an adequate degree of stability. The properties, in particular, the rheological properties, of the organic vehicle may be such that they lend good application properties to the thick film paste composition, including: stable dispersion of insoluble solids, appropriate rheology for application, appropriate wettability of the paste solids, a good drying rate, and good firing properties. The organic vehicle used in the thick film paste may be a nonaqueous inert liquid. The organic vehicle may be an organic solvent or preferably an organic solvent mixture; in an embodiment, the organic vehicle may be a solution of organic polymer(s) in organic solvent(s). In an embodiment, the polymer used for this purpose may be ethyl cellulose. Other examples of polymers which may be used alone or in combination include ethylhydroxyethyl cellulose, wood rosin, phenolic resins and poly(meth)acrylates of lower alcohols. Examples of suitable organic solvents comprise ester alcohols and terpenes such as alpha- or beta-terpineol or mixtures thereof with other solvents such as kerosene, dibutylsebacate, diethylene glycol butyl ether, diethylene glycol butyl ether acetate, hexylene glycol, 2,2,4-trimethyl-1,3-pentanediol monoisobutyrate and high boiling alcohols. Various combinations of these and other solvents may be formulated to obtain the viscosity and volatility requirements desired.

The organic vehicle content in the thick film paste may be dependent on the method of applying the thick film paste and the kind of organic vehicle used, and it can vary. In an embodiment, it may be from 4.9 to 15.9 wt. %, or, in an embodiment, it may be in the range of 6 to 12 wt. %, based on total thick film paste composition. The organic vehicle content includes organic solvent(s), possible organic polymer(s) and possible organic additive(s).

The organic solvent content in the thick film paste may be in the range of 2 to 10 wt. %, based on total thick film paste composition.

The organic polymer(s) may be present in the organic vehicle in a proportion in the range of 4 to 10 wt. %, based on total thick film paste composition.

The thick film paste of the invention may comprise one or more organic additives, for example, surfactants, thickeners, rheology modifiers and stabilizers. The organic additive(s) may be part of the organic vehicle. However, it is also possible to add the organic additive(s) separately when preparing the thick film paste. The organic additive(s) may be present in the thick film paste in a total proportion of, for example, 0 to 3 wt. %, based on total thick film paste composition.

The thick film paste of the invention is a viscous composition, which may be prepared by mechanically mixing the at least one particulate platinum (alloy), the at least one metal compound and the optional particulate platinum (alloy)/metal oxide composite with the organic vehicle. In an embodiment, the manufacturing method power mixing, a dispersion technique that is equivalent to the traditional roll milling, may be used; roll milling or other mixing technique can also be used.

The thick film paste of the invention can be used as such or may be diluted, for example, by the addition of additional organic solvent(s); accordingly, the weight percentage of all the other constituents of the thick film paste may be decreased.

The application viscosity of the thick film paste of the invention may be, for example, 100 to 600 Pas when measured at a spindle speed of 10 rpm and 25° C. by a utility cup using a Brookfield HBT viscometer and #14 spindle.

The thick film paste of the invention can be used in the manufacture of metallizations which may serve as electrical contacts for electrodes of sensors, in particular, high temperature gas sensors like exhaust gas sensors. Such sensors may serve to determine gas temperature and/or gas composition with regard to one or more gas components.

Therefore the invention relates also to a method for the manufacture of electrically conductive metallizations of sensors. The method comprises the steps:

(1) applying a thick film paste of the invention to a sensor substrate which is provided with an electrode, (2) drying the thick film paste so applied, and (3) firing the dried thick film paste to form an electrically conductive metallization on the sensor substrate, wherein the metallization is electrically connected with the electrode on the sensor substrate.

Step (1) is performed by applying a thick film paste of the invention to the sensor substrate which is already provided with an electrode which may take the form of an electrically conductive sub-layer, in particular. The sensor substrate itself is typically a conventional heat-resistant ceramic substrate, for example, an aluminum oxide substrate or a zirconium oxide substrate. The metallization is so applied as to make contact with the electrode. The thick film paste is typically applied in a fired thickness of, for example, 20 to 60 μm. The typical application method is printing, in particular, screen printing.

After application of the thick film paste it is typically dried and fired to form the finished electrically conductive metallization.

Drying may be performed, for example, for a period of 15 to 30 minutes with the sensor substrate reaching a peak temperature in the range of, for example, 100 to 160° C. Drying can be carried out making use of, for example, single or multi-zone belt ovens.

Firing may be performed for a period of, for example, 16 to 24 hours with the sensor substrate reaching a peak temperature in the range of, for example, 1200 to 1350° C. Firing can be carried out making use of a box furnace, for example. Firing may happen in the presence of oxygen, in particular, in the presence of air. During firing the organic substance including non-volatile organic material and the organic portion not evaporated during the possible drying step may be removed, i.e. burned and/or carbonized, in particular, burned. The organic substance removed during firing includes organic solvent(s), possible organic polymer(s) and possible organic additive(s).

The process step sequence (1) to (3) may be repeated several times, for example, 1 to 4 times. This may especially be expedient, when a high fired thickness of the metallization of, for example, 50 to 120 μm is desired.

EXAMPLES

The following examples are provided to aid in understanding of the invention, and are not intended to in any way limit the scope of the invention.

All of the reference examples 1 to 15 were made in an Inconel 601 metal tube. The details of the process variables are found in Table 1. The details of the platinum (alloy) powder or platinum/metal oxide composite characteristics are found in Table 2. Platinum alloy compositions and platinum/metal oxide compositions are presented in wt. %. The surface area was measured by the BET method using a Micromeritics Tristar. The Helium pycnometry density was measured using a Micromeritics Accupyc 1330. The particle size data was measured using a Micromeritics Microtrac S3500.

Reference Example 1 (Manufacture of Pure Platinum Powder)

A precursor solution was prepared using platinum nitrate solution diluted to the indicated wt. % metal concentration. An aerosol was then generated using air as the carrier gas flowing at 45 liters per minute and an ultrasonic generator with 36 ultrasonic transducers operating at 1.6 MHz. This aerosol was then sent through an impactor and then sent into a 3 zone furnace with the zones set at 1050° C. After exiting the furnace, the aerosol temperature was quenched with air flowing at 800 liters per minute and the dense finely divided platinum powder was collected in a bag filter. This powder had a surface area of 0.61 m$^2$/g, a density of 20.22 g/ml, and a particle size distribution of d10=0.57, d50=0.95, d90=1.87 and d95=2.32 μm.

Reference Example 2

A sample of an alloy powder containing platinum and palladium with the ratio of 50 wt. % platinum and 50 wt. % palladium was prepared using the same conditions as described in reference example 1.

Reference Example 3

A sample of an alloy powder containing platinum and palladium with the ratio of 75 wt. % platinum and 25 wt. % palladium was prepared using the same conditions as described in reference example 1.

Reference Examples 4-8

Samples of platinum composite powder with zirconium oxide were prepared using the same conditions as described in reference example 1. NYACOL® ZrO$_2$ (Acetate Stabilized), a preparation containing 20 wt. % ZrO$_2$, 15 wt. % acetic acid and 65 wt. % water, was added to the platinum nitrate solution to make the precursor solution. Platinum powders containing 0.02 wt. %, 0.1 wt. %, 0.25 wt. %, 0.5 wt. % and 1 wt. % ZrO$_2$ were prepared.

Reference Examples 9-13

Samples of platinum composite powder with manganese oxide were prepared using the same conditions as described in reference example 1. A solution of manganese (II) nitrate (50 wt. % concentration in dilute nitric acid) was added to the platinum nitrate solution to make the precursor solution. Platinum powders containing 0.25 wt. %, 0.5 wt. %, 0.75 wt. % and 1 wt. % $MnO_2$ were prepared.

Reference Examples 14-15

Samples of platinum composite powder with magnesium oxide were prepared using the same conditions as described in reference example 1. Magnesium nitrate hexahydrate $Mg(NO_3)_2 \cdot 6H_2O$ was dissolved in water and added to the platinum nitrate solution to make the precursor solution. Platinum powders containing 0.02 wt. % and 0.1 wt. % MgO were prepared.

The example thick film pastes were screen printed twice on an alumina substrate in a total fired layer thickness of 90-128 μm (layer 1: 44-79 μm, layer 2: 73-103 μm). Each print was dried 30 minutes with the substrate reaching a peak temperature of 150° C. and then fired 30 minutes with the substrate reaching a peak temperature of 1250° C.

The 60 $mm^2$ surface of the finished print was then microscopically evaluated (25× magnification).

Table 3 shows paste compositional data and the results of the surface evaluations.

TABLE 1

| Ref. Ex. | Material | wt. % Pt | wt. % Pd | Metal Oxide | Metal Oxide Conc. | Carrier (l/min) | Quench (l/min) | Furnace (° C.) | Number of Transducers |
|---|---|---|---|---|---|---|---|---|---|
| 1 | Pt | 100 | 0 | none | 0.0 | 10 | 45 | 800 | 1050 | 36 |
| 2 | PtPd | 50 | 50 | none | 0.0 | 10 | 45 | 1100 | 1050 | 36 |
| 3 | PtPd | 75 | 25 | none | 0.0 | 5 | 15 | 300 | 1050 | 12 |
| 4 | PtZrO2 | 99.98 | 0 | ZrO2 | 0.02 | 10 | 45 | 700 | 1050 | 36 |
| 5 | PtZrO2 | 99.90 | 0 | ZrO2 | 0.1 | 10 | 45 | 700 | 1050 | 36 |
| 6 | PtZrO2 | 99.75 | 0 | ZrO2 | 0.25 | 10 | 45 | 750 | 1000 | 36 |
| 7 | PtZrO2 | 99.50 | 0 | ZrO2 | 0.5 | 10 | 45 | 700 | 1000 | 36 |
| 8 | PtZrO2 | 99.00 | 0 | ZrO2 | 1 | 10 | 45 | 700 | 1000 | 36 |
| 9 | PtMnO2 | 99.75 | 0 | MnO2 | 0.25 | 10 | 45 | 700 | 1050 | 36 |
| 10 | PtMnO2 | 99.50 | 0 | MnO2 | 0.5 | 10 | 45 | 700 | 1050 | 36 |
| 11 | PtMnO2 | 99.25 | 0 | MnO2 | 0.75 | 10 | 45 | 700 | 1050 | 36 |
| 12 | PtMnO2 | 99.00 | 0 | MnO2 | 1 | 10 | 45 | 700 | 1050 | 36 |
| 13 | PtMnO2 | 98.00 | 0 | MnO2 | 2 | 3.5 | 45 | 700 | 1050 | 36 |
| 14 | PtMgO | 99.98 | 0 | MgO | 0.02 | 10 | 45 | 700 | 1050 | 36 |
| 15 | PtMgO | 99.90 | 0 | MgO | 0.1 | 10 | 45 | 700 | 1050 | 36 |

TABLE 2

| Ref. Ex. | Material | wt. % Pt | wt. % Pd | Metal Oxide | Metal Oxide | Surface Area | He Pyc (Density) | d10% | d50% | d90% | d95% |
|---|---|---|---|---|---|---|---|---|---|---|---|
| 1 | Pt | 100 | 0 | none | 0.0 | 0.61 | 20.22 | 0.57 | 0.95 | 1.87 | 2.32 |
| 2 | PtPd | 50 | 50 | none | 0.0 | 0.67 | 14.89 | 0.56 | 0.95 | 2.30 | 3.26 |
| 3 | PtPd | 75 | 25 | none | 0.0 | 672 | 16.74 | 0.42 | 0.70 | 1.46 | 1.90 |
| 4 | PtZrO2 | 99.98 | 0 | ZrO2 | 0.02 | 0.63 | 21.07 | 0.54 | 0.94 | 1.81 | 2.21 |
| 5 | PtZrO2 | 99.90 | 0 | ZrO2 | 0.1 | 0.88 | 20.89 | 0.55 | 0.82 | 1.45 | 1.79 |
| 6 | PtZrO2 | 99.75 | 0 | ZrO2 | 0.25 | 0.54 | 20.78 | 0.53 | 0.81 | 1.49 | 1.83 |
| 7 | PtZrO2 | 99.50 | 0 | ZrO2 | 0.5 | 0.61 | 19.56 | 0.58 | 0.87 | 1.56 | 1.91 |
| 8 | PtZrO2 | 99.00 | 0 | ZrO2 | 1 | 0.71 | 19.59 | 0.56 | 0.87 | 1.62 | 1.99 |
| 9 | PtMnO2 | 99.75 | 0 | MnO2 | 0.25 | 1.09 | 20.39 | 0.59 | 0.84 | 1.46 | 1.78 |
| 10 | PtMnO2 | 99.50 | 0 | MnO2 | 0.5 | 0.91 | 20.31 | 0.58 | 0.87 | 1.51 | 1.82 |
| 11 | PtMnO2 | 99.25 | 0 | MnO2 | 0.75 | 0.98 | 20.23 | 0.57 | 0.64 | 1.02 | 1.26 |
| 12 | PtMnO2 | 99.00 | 0 | MnO2 | 1 | 1.27 | 19.79 | 0.61 | 0.78 | 1.50 | 1.91 |
| 13 | PtMnO2 | 98.00 | 0 | MnO2 | 2 | 0.71 | 18.93 | 0.44 | 0.81 | 1.50 | 1.86 |
| 14 | PtMgO | 99.98 | 0 | MgO | 0.02 | 0.65 | 20.89 | 0.51 | 0.78 | 1.50 | 1.91 |
| 15 | PtMgO | 99.90 | 0 | MgO | 0.1 | 0.59 | 20.63 | 0.53 | 0.81 | 1.50 | 1.86 |

Example thick film pastes were made by mixing reference example materials and, optionally, metal compounds into an organic medium (5.4 wt. % ethyl cellulose solution in a butyl sebacate/2,2,4-trimethyl-1,3-pentanediol mono(2-methylpropanoate) solvent mixture). Then the mixture was roll-milled until a FOG (fineness of grind) of <15/5 was obtained (less than 15 μm for the fourth longest continuous scratch and less than 5 μm for the point at which 50% of the paste is scratched; FOG was determined using a conventional grindometer having a 25 μm block). The pastes were then diluted by addition of butyl sebacate and/or 2,2,4-trimethyl-1,3-pentanediol mono(2-methylpropanoate to obtain a 70:30 by weight mixture of butyl sebacate and 2,2,4-trimethyl-1,3-pentanediol mono(2-methylpropanoate in the pastes.

TABLE 3

| Thick film paste | Ethyl cellulose + organic solvents (wt. %) | Wt. %/ reference example | Wt. %/ metal compound | FOG | Surface |
|---|---|---|---|---|---|
| 1* | 14.5 | 85.5/1 | ./. | 10/2 | + |
| 2 | 14.0 | 85.0/1 | 1.0/RuO2 | 10/2 | ++ |

*comparative example
+, 40 to 50% of the 60 $mm^2$ surface has large cracks
++, >5 to <20% of the 60 $mm^2$ surface has small cracks
+++, >1 to <5% of the 60 $mm^2$ surface has smaller cracks
++++, <1% of the 60 $mm^2$ surface has smaller cracks

What is claimed is:

1. A thick film paste composition comprising:
   (a) inorganic constituents that consist of:
      a platinum source that is at least one of a particulate platinum (alloy) or a particulate platinum (alloy)/metal oxide composite, and
      at least one metal compound selected from the group consisting of particulate metal oxides and precursor compounds capable of forming a metal oxide on firing, the metal oxide in each case being selected from the group consisting of NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, and $MnO_2$; and
   (b) an organic vehicle,
   and wherein:
      the proportion of the at least one metal compound is 0.001 to 1 wt. %, based on the total thick film paste composition; and
      the thick film paste composition is capable of being fired to form an electrically conductive metallization that is electrically connected with an electrode on a ceramic sensor substrate.

2. The thick film paste composition of claim 1, wherein the at least one metal compound is selected from the group consisting of precursor compounds capable of forming a metal oxide on firing, the metal oxide being selected from the group consisting of NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, and $MnO_2$.

3. The thick film paste composition of claim 1, wherein the precursor compound is a metal carbonate, a metal carboxylic acid salt, or a metal resinate.

4. The thick film paste composition of claim 1, wherein the platinum source is at least one particulate platinum (alloy).

5. The thick film paste composition of claim 1, wherein the platinum source is at least one particulate platinum (alloy)/metal oxide composite, in which the metal oxide is at least one oxide selected from the group consisting of NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, and $MnO_2$.

6. The thick film paste composition of claim 1, comprising 84 to 95 wt. % of the platinum source, based on total thick film paste composition.

7. The thick film paste composition of claim 1, wherein the at least one particulate platinum (alloy)/metal oxide composite has a weight ratio of elemental platinum plus optionally present alloying metal(s):metal oxide of 100:1 to 1000:1.

8. The thick film paste composition of claim 1, wherein the platinum source comprises the particulate platinum (alloy) and the particulate platinum (alloy)/metal oxide composite, and a weight ratio of particulate platinum (alloy):particulate platinum (alloy)/metal oxide composite is in the range of 20:80 to 99.9:0.1.

9. The thick film paste composition of claim 1, wherein the platinum (alloy) is elemental platinum without an alloyed metal.

10. The thick film paste composition of claim 1, wherein the organic vehicle content is in the range of 4.9 to 15.9 wt. %.

11. A method for the manufacture of a sensor having an electrically conductive metallization, comprising the steps:
    (a) applying the thick film paste composition of claim 1 to a sensor substrate which is provided with an electrode;
    (b) drying the thick film paste composition so applied; and
    (c) firing the dried thick film paste composition to form an electrically conductive metallization on the sensor substrate, wherein the metallization is electrically connected with the electrode on the sensor substrate.

12. The method of claim 11, wherein firing is performed for a period of 16 to 24 hours with the sensor substrate reaching a peak temperature in the range of 1200 to 1350° C.

13. The method of claim 11, wherein the step sequence (a) to (c) is repeated 1 to 4 times.

14. A sensor, comprising a sensor substrate having an electrode thereon and an electrically conductive metallization electrically connected with the electrode, the metallization having been formed by a process comprising:
    (a) applying the thick film paste composition of claim 1 to the sensor substrate;
    (b) drying the thick film paste composition so applied; and
    (c) firing the dried thick film paste composition to form the electrically conductive metallization on the sensor substrate.

15. A thick film paste composition comprising:
    (a) inorganic constituents that consist of:
       a platinum source that comprises a particulate platinum (alloy) and a particulate platinum (alloy)/metal oxide composite, wherein a weight ratio of particulate platinum (alloy):particulate platinum (alloy)/metal oxide composite is in the range of 20:80 to 99.9:0.1, and
       at least one metal compound selected from the group consisting of particulate metal oxides and precursor compounds capable of forming a metal oxide on firing, the metal oxide in each case being selected from the group consisting of NiO, $SiO_2$, $RuO_2$, $Rh_2O_3$, $IrO_2$, $Cu_2O$, CuO, $TiO_2$, $ZrO_2$, PbO, $SnO_2$, $CeO_2$, $Al_2O_3$, MgO, $MnO_2$ and $MoO_2$; and
    (b) an organic vehicle,
    and wherein:
       the proportion of the at least one metal compound is 0.001 to 1 wt. %, based on the total thick film paste composition; and
       the thick film paste composition is capable of being fired to form an electrically conductive metallization that is electrically connected with an electrode on a ceramic sensor substrate.

16. The thick film paste composition of claim 15, wherein the at least one particulate platinum (alloy)/metal oxide composite has a weight ratio of elemental platinum plus optionally present alloying metal(s):metal oxide of 100:1 to 1000:1.

* * * * *